US010171083B2

(12) United States Patent
Swartzlander et al.

(10) Patent No.: US 10,171,083 B2
(45) Date of Patent: Jan. 1, 2019

(54) MEMRISTOR LOGIC DESIGN USING DRIVER CIRCUITRY

(71) Applicant: Board of Regents, The University of Texas System, Austin, TX (US)

(72) Inventors: Earl Swartzlander, Austin, TX (US); Lauren Guckert, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/369,364

(22) Filed: Dec. 5, 2016

(65) Prior Publication Data

US 2018/0159536 A1    Jun. 7, 2018

(51) Int. Cl.
*H03K 19/173*    (2006.01)
*G11C 13/00*    (2006.01)

(52) U.S. Cl.
CPC ....... *H03K 19/173* (2013.01); *G11C 13/0069* (2013.01)

(58) Field of Classification Search
None
See application file for complete search history.

(56) References Cited

U.S. PATENT DOCUMENTS 7,902,857 B1 *   3/2011   Pino ................... G11C 13/0069
                                                                326/14
8,773,167 B2     7/2014   Robinett et al.
2012/0014169 A1 *  1/2012   Snider ................... G11C 5/141
                                                                365/148
2013/0311413 A1 * 11/2013   Rose ..................... G06N 3/0635
                                                                706/25

(Continued)

FOREIGN PATENT DOCUMENTS

WO    2017144862 A1    8/2017

OTHER PUBLICATIONS

Bickerstaff et al., "Memristor-based Arithmetic," Conference Record of the 44th Asilomar Conference on Signals, Systems and Computers (ASILOMAR), Pacific Grove, CA, United States, Nov. 7-10, 2010, pp. 1173-1177.

(Continued)

*Primary Examiner* — Minh D A
*Assistant Examiner* — James H Cho
(74) *Attorney, Agent, or Firm* — Robert A. Voigt, Jr.; Winstead, P.C.

(57)    ABSTRACT

A new lower-power gate design for memristor-based Boolean operations. Such a design offers a uniform cell that is configurable to perform all Boolean operations, including the XOR operation. For example, a circuit to perform the AND operation utilizes a first memristor and a second memristor connected in series. The circuit further includes a switch, where a node of the second memristor is connected to the switch. Furthermore, the circuit includes a third memristor connected to the switch in series, where the switch and the third memristor are connected in parallel to the first and second memristors. Additionally, the first voltage source is connected to the first memristor via a first resistor. In addition, a second voltage source is connected in series to the switch and the third memristor. In such a design, the delay is reduced to a single step and the area is reduced to at most 3 memristors.

15 Claims, 6 Drawing Sheets

(56) References Cited

U.S. PATENT DOCUMENTS

| | | | |
|---|---|---|---|
| 2014/0028347 A1 | 1/2014 | Robinett et al. | |
| 2015/0256178 A1* | 9/2015 | Kvatinsky | H03K 19/00346 326/31 |
| 2016/0020766 A1* | 1/2016 | Miao | H03K 19/0002 326/37 |
| 2016/0189772 A1 | 6/2016 | Mohammad et al. | |
| 2017/0337968 A1* | 11/2017 | Jagtap | G11C 13/0097 |

OTHER PUBLICATIONS

Kvatinsky et al., "Memristor-Based Material Implication (IMPLY) Logic: Design Principles and Methodologies," IEEE Transactions on Very Large Scale Integration (VLSI) Systems, vol. 22, Issue 10, Oct. 2014, pp. 2054-2066.

Kvatinsky et al., "MAGIC—Memristor Aided LoGIC," IEEE Transactions on Circuits and Systems II: Express Briefs, vol. 61, Issue 11, Nov. 2014, pp. 895-899.

Mahajan et al., "Memristor Based Adders," Conference Record of the 48th Asilomar Conference on Signals, Systems and Computers, Pacific Grove, United States, Nov. 2-5, 2014, pp. 1256-1260.

Lauren E. Guckert, "Memristor-Based Arithmetic Units," Ph.D. Defense, Oct. 28, 2016, pp. 1-166.

Kvatinsky et al., "MRL—Memristor Ratioed Logic," 13th International Workshop on Cellular Nanoscale Networks and Their Applications (CNNA), Aug. 29-31, 2012, pp. 1-6.

Teimoory et al., "Optimized Implementation of Memristor-Based Full Adder by Material Implication Logic," 21st IEEE International Conference on Electronics, Circuits and Systems (ICECS), Marseille, France, 2014, pp. 1-4.

Zhang et al., A Novel Design for Memristor-Based Logic Switch and Crossbar Circuits, IEEE Transactions on Circuits and Systems-I: Regular Papers, vol. 62, No. 5, May 2015, pp. 1402-1411.

Zhang et al., "A Novel Design for a Memristor-Based OR Gate," IEEE Transactions on Circuits and Systems-II: Express Briefs, vol. 62, No. 8, Aug. 2015, pp. 781-785.

Guckert et al., "MAD Gates—Memristor Logic Design Using Driver Circuitry," IEEE Transactions on Circuits and Systems II: Express Briefs, vol. PP, No. 99, Apr. 7, 2016, pp. 1-5.

Shaltoot et al., "Memristor Based Carry Lookahead Adder Architectures," 2012 IEEE 55th International Midwest Symposium on Circuits and Systems (MWSCAS), Aug. 2012, pp. 298-301.

Revanna et al., "Memristor Based Adder Circuit Design," 2016 50th Asilomar Conference on Signals, Systems and Computers, Nov. 2016, pp. 162-166.

* cited by examiner

TABLE I: Latency Comparisons for MAD Gates and Prior Memristor-Based Gates

| Operation | IMPLY | Hybrid-CMOS | MAGIC | Zhang | Threshold | MAD |
|---|---|---|---|---|---|---|
| p NAND q | 2 | 2 | 1 | 3 | 2 | 1 |
| p AND q | 3 | 1 | 1 | 1 | 1 | 1 |
| p NOR q | 5 | 2 | 1 | 3 | 2 | 1 |
| p OR q | 4 | 1 | 1 | 1 | 1 | 1 |
| p XOR q | 8 | 3 | N/A | N/A | 3 | 1 |
| NOT p | 1 | 1 | 1 | 2 | 1 | 1 |

TABLE II: Area Comparisons for MAD Gates and Prior Memristor-Based Gates

| Operation | IMPLY | Hybrid-CMOS | MAGIC | Zhang | Threshold | MAD |
|---|---|---|---|---|---|---|
| p NAND q | 3 memristors 3 drivers | 2 memristors 2 MOSFETs | 3 memristors | 2 memristors | 2 memristors 1 GOTO pair 2 MOSFETs | 3 memristors 2 drivers |
| p AND q | 4 memristors 4 drivers | 2 memristors | 3 memristors | 2 memristors | 2 memristors 1 GOTO pair | 3 memristors 2 drivers |
| p NOR q | 6 memristors 6 drivers | 2 memristors 2 MOSFETs | 3 memristors | 2 memristors | 2 memristors 1 GOTO pair 2 MOSFETs | 3 memristors 3 drivers |
| p OR q | 6 memristors 6 drivers | 2 memristors | 3 memristors | 2 memristors | 2 memristors 1 GOTO pair | 3 memristors 2 drivers |
| p XOR q | 7 memristors 7 drivers | 6 memristors 2 MOSFETs | N/A | N/A | 5 memristors 3 GOTO pair 2 MOSFETs | 3 memristors 2 drivers |
| NOT p | 2 memristors 2 drivers | 2 MOSFETs | 2 memristors | 2 memristors | 2 MOSFETs | 2 memristors 2 drivers |

FIG. 5

TABLE III: Energy Comparisons for MAD Gates and Prior Memristor-Based Gates (Joules)

| Operation | IMPLY | Hybrid-CMOS | Zhang | MAD |
|---|---|---|---|---|
| p NAND q | 7.1e-13 | N/A | 2.5e-19 | 3e-14 |
| p AND q | 1.044e-12 | 1.75e-13 | 2.5e-19 | 3e-14 |
| p NOR q | 1.044e-12 | N/A | 2.5e-19 | 3.3e-14 |
| p OR q | 7.1e-13 | 1.75e-13 | 2.5e-19 | 3.3e-14 |
| p XOR q | 3.03e-12 | N/A | 2.5e-19 | 3.3e-14 |
| NOT p | 3.4e-13 | 1.75e-13 | 2.5e-19 | 3.3e-14 |

MEMRISTOR LOGIC DESIGN USING DRIVER CIRCUITRY

TECHNICAL FIELD

The present invention relates generally to memristors, and more particularly to utilizing memristor logic design using driver circuitry to reduce the area and delay for low-power gate designs.

BACKGROUND

Memristors were first hypothesized by Leon Chua in 1971, and since then research has explored the potential for these devices in modern system design. The most direct benefits of memristors, low area and high density, lend themselves to improved memory design, sparking the majority of prior research. Only recently has research begun to explore the use of memristors in arithmetic applications. The work that has been done has focused on individual logic gates and small circuits. There have been numerous approaches to this endeavor: IMPLY operations, MAGIC gates, logic-in-memory, hybrid-CMOS gates, and threshold gates, to name the most prevalent.

Unfortunately, each prior approach to memristor-based logic has shortcomings. IMPLY gates are serialized and incur high delays for Boolean operations. Hybrid-CMOS gates suffer from signal degradation. MAGIC gates and logic-in-memory designs are limited in applications since they cannot be concatenated or provide multiple fanout. Threshold gates using GOTO pairs, although low in area and delay, are still in their infant stages in terms of fabrication.

Hence, all prior designs for memristor-based gates have had shortcomings in terms of scalability, applicability, completeness and performance.

SUMMARY

In one embodiment of the present invention, a logic gate comprises a first memristor and a second memristor connected in series. The logic gate further comprises a switch, where a node of the second memristor is connected to the switch. The logic gate additionally comprises a third memristor connected to the switch in series, where the switch and third memristor are connected in parallel to the first and second memristors. Furthermore, the logic gate comprises a first voltage source connected to the first memristor via a first resistor. Additionally, the logic gate comprises a second voltage source connected in series to the switch and third memristor.

In another embodiment of the present invention, a logic gate comprises a first memristor and a second memristor connected in series. The logic gate further comprises a first switch connected to the first memristor. The logic gate additionally comprises a second switch. Furthermore, the logic gate comprises a third memristor connected to the second switch in series, where the second switch and the third memristor are connected in parallel to the first and second memristors. Additionally, the logic gate comprises a first voltage source connected to the first memristor via a first resistor. In addition, the logic gate comprises a second voltage source connected in series to the second switch and the third memristor.

In a further embodiment of the present invention, a logic gate comprises a first memristor. The logic gate further comprises a switch connected to a node of the first memristor. The logic gate additionally comprises a second memristor connected to the switch in series, where the switch and the second memristor are connected in parallel to the first memristor. Furthermore, the logic gate comprises a first voltage source connected to the first memristor via a first resistor. Additionally, the logic gate comprises a second voltage source connected in series to the switch and the second memristor.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art.

As stated in the Background section, memristors have recently begun to be explored in arithmetic operations. However, all prior designs for memristor-based gates have had shortcomings in terms of scalability, applicability, completeness and performance.

The principles of the present invention provide a new lower-power gate design, Memristors-As-Drivers gates (hereinafter "MAD" gates), which overcomes each of these issues by combining sense circuitry with the IMPLY operation. By using the values of the input memristors as the driver for the output memristor, the delay is reduced to a single step for any Boolean operation, including XOR. The area is reduced to at most 3 memristors for each gate and only consumes 30 fJ. Furthermore, as discussed herein, an N-bit ripple carry adder implementation is proposed which uses these gates to achieve a total delay of N+1 with an area of 8N memristors and their drivers. The individual bits of the proposed adder can also be pipelined thereby reducing the latency to four steps per addition.

Figure 1:
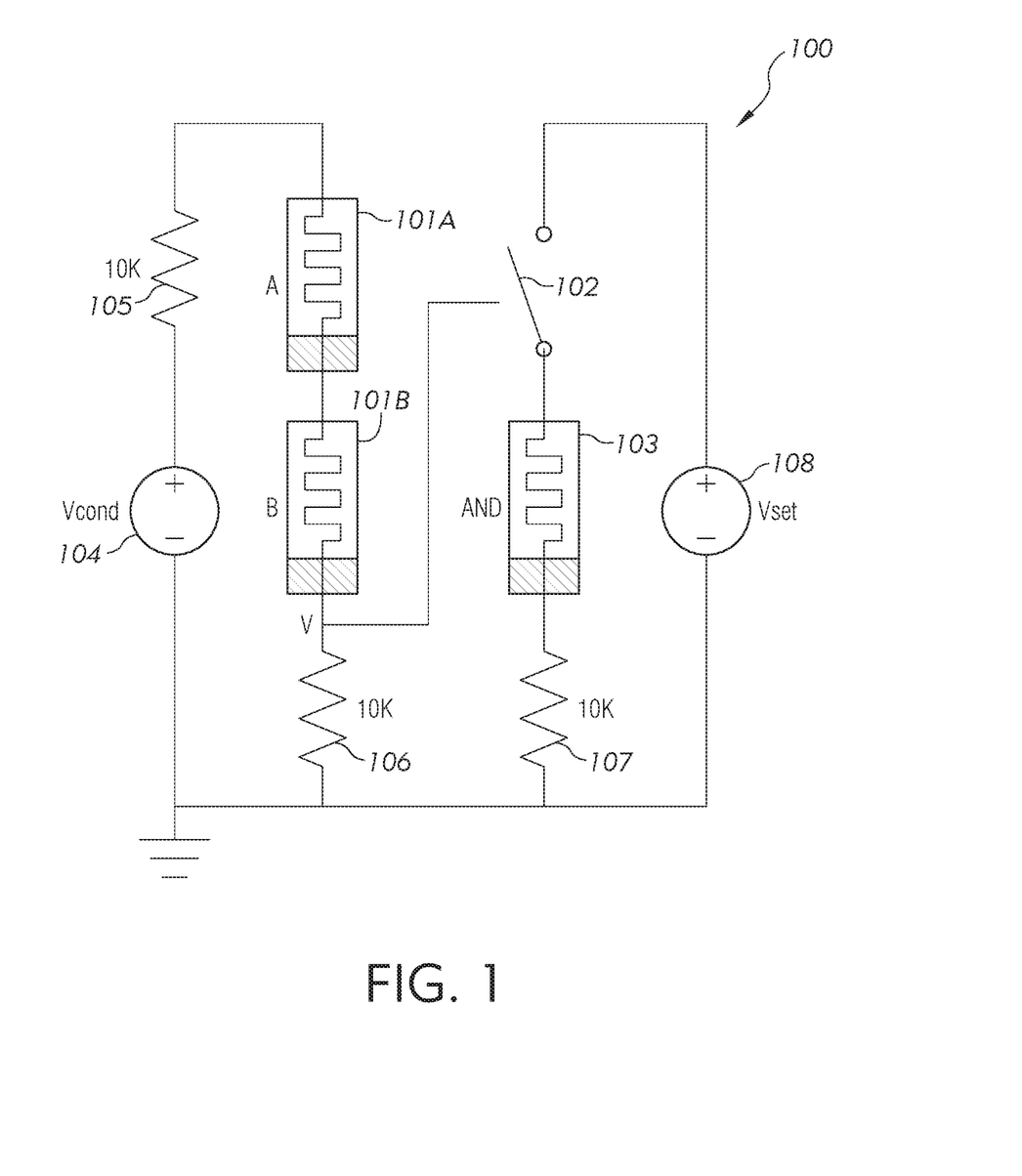
FIG. 1 illustrates a Memristors-As-Drivers (MAD) implementation for an AND gate in accordance with an embodiment of the present invention.

Referring now to the Figures in detail, FIG. 1 illustrates a MAD implementation for an AND gate 100 in accordance with an embodiment of the present invention. AND gate 100 includes two memristors 101A-101B connected in series for the inputs and a switch 102 paired with a third memristor 103, AND, in series for the result. This adder assumes that the values of A and B are preloaded into the input memristors 101A-101B, respectively. In one embodiment, this can be done with standard IMPLY set or copy operations or with the circuitry discussed later herein.

In one embodiment, AND gate 100 includes a voltage source, $V_{cond}$, 104 connected to ground and to memristor 101A via resistor 105 with a value of 10,000 ohms (10K ohms). Furthermore, as shown in FIG. 1, in one embodiment, memristor 101B is connected to ground via resistor 106 with a value of 10,000 ohms (10K ohms). A node ("V") of memristor 101B connected to resistor 106 is connected to switch 102. Furthermore, in one embodiment, memristor 103 is connected to ground via resistor 107 with a value of 10,000 ohms (10K ohms). Additionally, as shown in FIG. 1, AND gate 100 has an output voltage source 108, $V_{set}$, connected in series to switch 102 and memristor 103.

To perform the AND operation, the read voltage $V_{cond}$ 104 is applied to the input memristors 101A, 101B in series. The magnitude of $V_{cond}$ 104 is selected to be a voltage below the threshold voltage, $V_{th}$, of memristors 101A, 101B to ensure that the values of memristors 101A, 101B remain unchanged during the sensing stage. At the same time, a voltage, $V_{set}$ 108, is gated to the n terminal of the result memristor 103. The voltage $V_{set}$ 108 is selected to be a voltage greater than $V_{th}$ of memristor 103, to ensure the value of the result memristor 103 is correctly set. In one embodiment, $V_{cond}$ 104=1.6V and $V_{set}$ 108=−2.5V.

The application of the $V_{cond}$ 104 and $V_{set}$ 108 voltages are similar to standard IMPLY operations. However, the $V_{set}$ 108 voltage on the output memristor 103 is gated by the voltage of the input circuit at node V. If the voltage sensed at node V is greater than the threshold of switch 102 on the output memristor 103, switch 102 will close and the $V_{set}$ voltage 108 will set the result memristor 103 to a logical value of "1," else the memristor 103 will remain a value of "0." Let the threshold of the switch be called $V_{apply}$.

In this circuit, when both input memristors 101A-101B have the output of the logical value of "1," the voltage at node V is 16/22 V. If memristors 101A-101B both have the output value of "0," the voltage at node V is 16/220 V. If one of the memristors 101A, 101B have an output value of the logical value of "1" and the other has an output value of "0," then the voltage of node V is 16/121 V. Thus, to perform the AND operation, $V_{apply}$ is chosen such that 16/121 V<$V_{apply}$<16/22 V. In one embodiment, $V_{apply}$ is chosen to be 0.5V. The same circuit can be reused to accomplish the remaining Boolean operations by varying the value of $V_{apply}$. For example, for the OR operation (see FIG. 2A), $V_{apply}$ should be selected such that 16/220<$V_{apply}$<16/121. The circuit can also be used to accomplish a COPY operation (see FIG. 2D). The NOT and COPY operations only require a single input memristor, but take the same form otherwise (see FIGS. 2C and 2D, respectively). The respective circuits for the OR, XOR, NOT, and COPY operations using a MAD implementation are shown in FIGS. 2A-2D in accordance with an embodiment of the present invention.

The differences between FIG. 1 and the circuits for the OR, XOR, NOT, and COPY operations as shown in FIGS. 2A-2D, respectively, will now be discussed. It is noted that the same circuit elements used in FIGS. 2A-2D as in FIG. 1 will be labeled with the same element number as used in FIG. 1 and will not be discussed below for the sake of brevity.

Figure 2A:
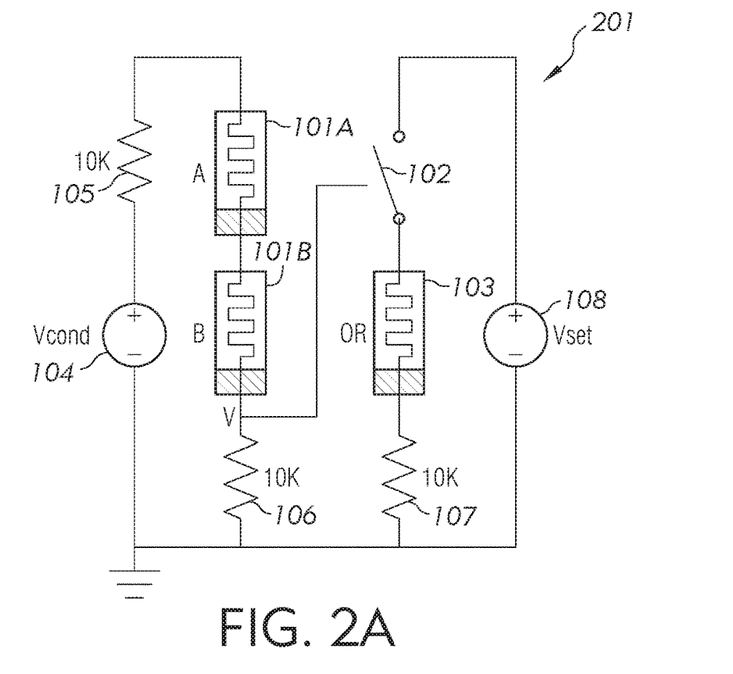
FIGS. 2A-2D illustrate the circuits for the OR, XOR, NOT, and COPY, respectively, using a MAD implementation in accordance with an embodiment of the present invention.

As shown in FIG. 2A, OR gate 201 now uses memristor 103 for the OR operation.

Figure 2B:
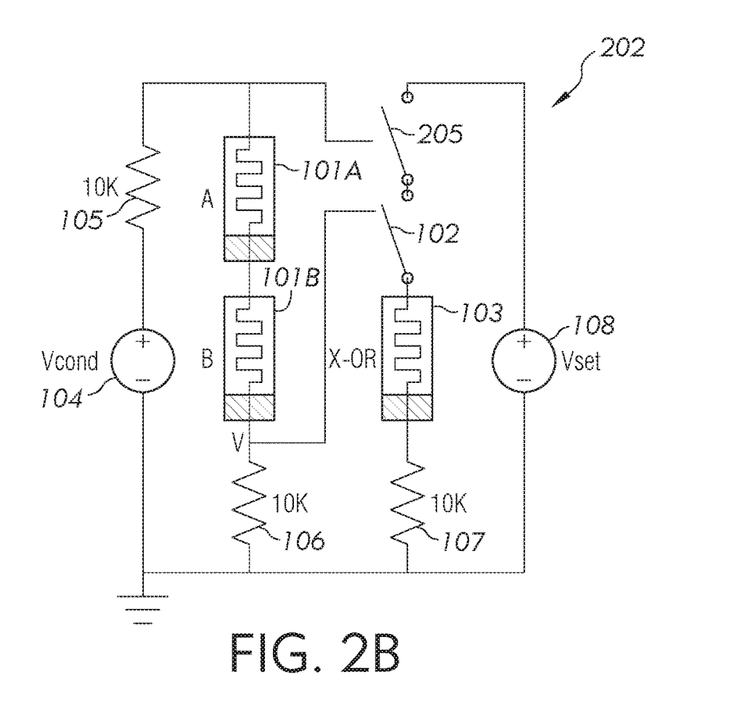

As shown in FIG. 2B, X-OR gate 202 now utilizes a second gate 205 connected to a node of memristor 101A. Furthermore, X-OR gate 202 uses memristor 103 for the X-OR operation.

Figure 2C:
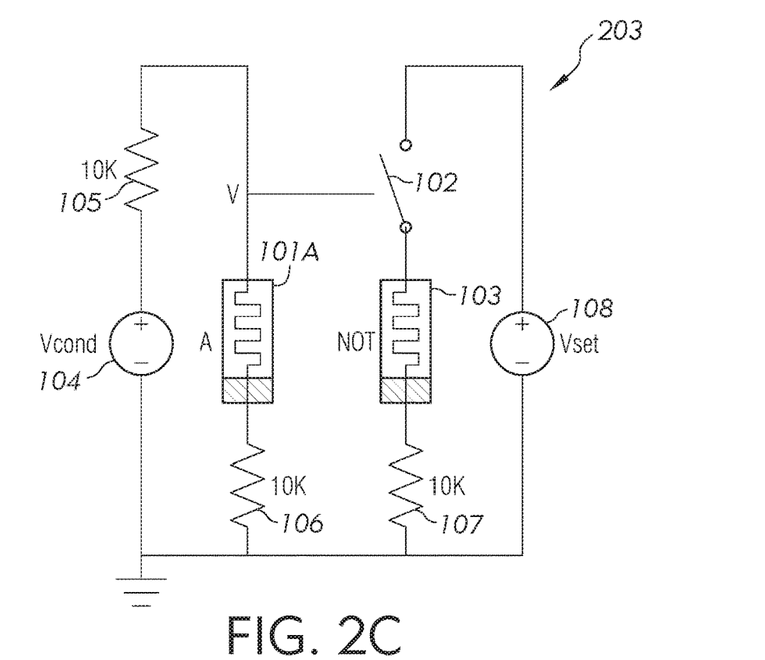

As shown in FIG. 2C, NOT gate 203 now utilizes a single memristor 101A, as opposed to two input memristors, which is connected to ground via resistor 106. Furthermore, as shown in FIG. 2C, the node (V) of memristor 101A connected to resistor 105 is connected to switch 102. Memristor 103 is now used for the NOT operation.

Figure 2D:
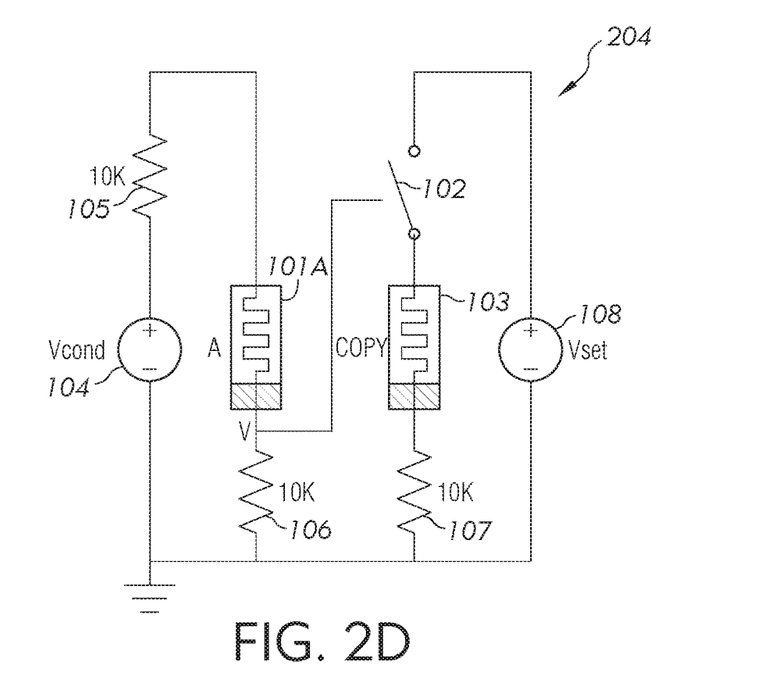

As shown in FIG. 2D, COPY gate 204 now utilizes a single memristor 101A, as opposed to two input memristors, which is connected to ground via resistor 106. Furthermore, as shown in FIG. 2D, the node (V) of memristor 101A connected to ground is connected to switch 102. Memristor 103 is now used for the COPY operation.

Hence, the design of AND gate 100 offers a uniform standardized cell that can be configured with a threshold that depends on the gate and application. In addition to uniformity, these circuits offer improved latency over four of the approaches: IMPLY operations, hybrid-CMOS, Zhang et al. (Zhang et al., "A Novel Design for a Memristor-Based OR gate," IEEE Transactions on Circuits and Systems II: Express Briefs, Vol. 62, August 2015, pp. 781-785), and threshold gate implementations. All Boolean operations can be performed in 1 IMPLY delay, including the XOR operation. Although MAGIC gates also offer a single step delay, operations on the same inputs cannot be performed in parallel and the XOR operation is not implemented. A full delay comparison of the gate delays are given in Table I of FIG. 3 in accordance with an embodiment of the present invention.

Figure 3:
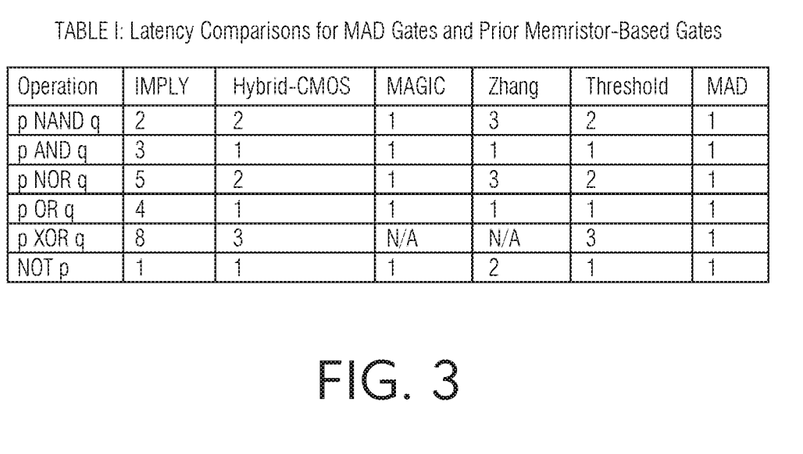
FIG. 3 is a table, Table 1, showing a full delay comparison of the gate delays in accordance with an embodiment of the present invention.

Referring to Table 1 of FIG. 3, the latencies are given in terms of the number of steps to complete the operation which are not necessarily equivalent across the various approaches. For example, a hybrid-CMOS step is a gate delay, whereas, an IMPLY, MAGIC, or MAD step is the application of a drive signal. However, MAD gates offer fast switching times with respect to prior work. The transition time from a value of "0" to a logical value of "1" for the output memristor 103 in a MAD gate is shown in FIG. 4 in accordance with an embodiment of the present invention.

Figure 4:
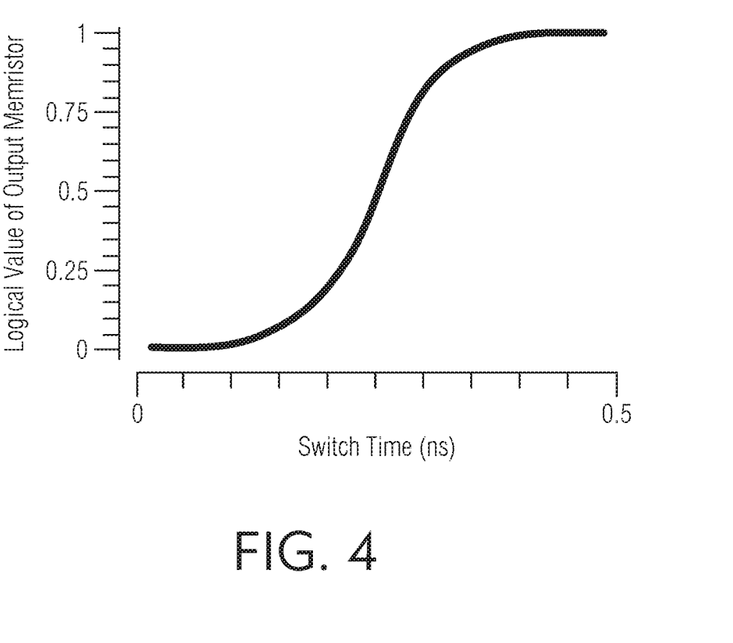
FIG. 4 shows the transition time from a value of "0" to a logical value of "1" for the output memristor in a MAD gate in accordance with an embodiment of the present invention.

The operation shown in FIG. 4 is A AND B for A=1 and B=1, however, all operations have the same transition time of 0.4 ns. This is three times faster than the transition times of 1.25 ns in prior work on logic-in-memory. A complete breakdown of the area comparisons for the various Boolean operations is provided in Table II of FIG. 5 in accordance with an embodiment of the present invention.

Figure 5:
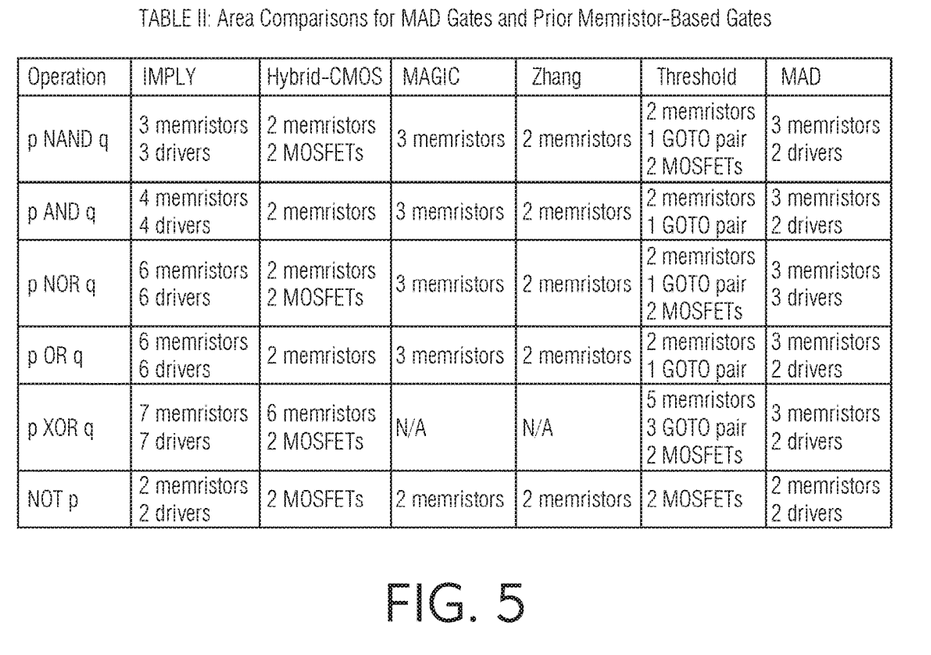
FIG. 5 is a table, Table II, showing a complete breakdown of the area comparisons for the various Boolean operations in accordance with an embodiment of the present invention.

In comparison to IMPLY gates, the MAD gates offer improved area for every Boolean operation. In comparison to the hybrid-CMOS gates, the MAD gates require greater area for the AND and OR operations, but less area for the remaining gates. Also, there is no need for signal restoration in circuits built from the proposed gate structure as required in hybrid-CMOS designs. This is because signals do not propagate through the circuits, but rather serve as sense voltages. Furthermore, there is no additional circuitry required for resetting, writing, and reading the memristors, such as switches or comparators, for the proposed MAD gates in comparison to the MAGIC gates and Zhang et al. Neither is there logic required for concatenating the gates as in the MAGIC gates and Zhang et al. The area requirements for the threshold gate approach are comparable with the exception of the XOR gate, for which the MAD design has significantly lower area.

MAD designs offer further area savings when the same inputs are used for multiple gates by reusing the input circuitry. For example, performing A AND B and A OR B in parallel would require the input memristors 101A-101B and two output memristors 103. Thus, for N gates using the same inputs A and B, the design only requires N+2 memristors rather than 3N.

Figure 6:
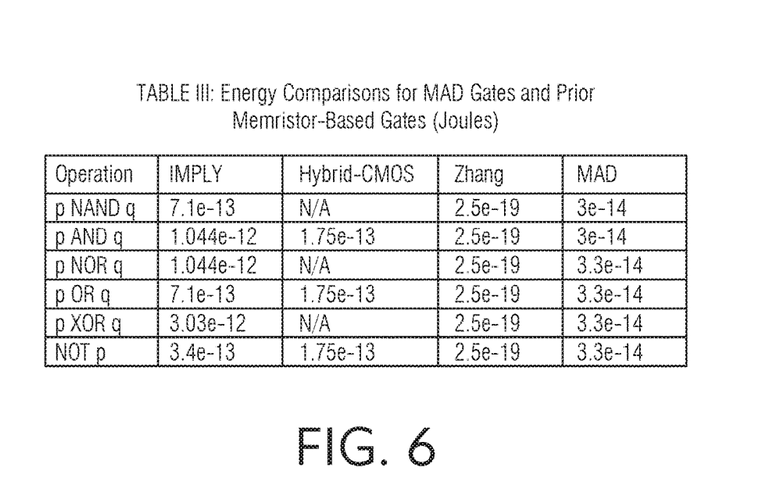
FIG. 6 is a table, Table III, showing that MAD gates improve in energy consumption over prior work in accordance with an embodiment of the present invention.

MAD gates also improve in energy consumption over prior work as shown in Table III of FIG. 6 in accordance with an embodiment of the present invention.

This energy was calculated by integrating V*I characteristics across the execution of the operation. The MAD gates improve energy by an order of magnitude over the IMPLY approach, mostly because of the large number of steps required for IMPLY operations. MAD gates require about 20% that of hybrid gates. The energy value for hybrid gates was computed by integrating the reported power and duration values in prior work. Zhang et al. report lower power requirements than the MAD gates, but the measurement is in terms of mean power per bit and it is unclear exactly how this is measured. Although direct comparisons may not be applicable, these values are included for completeness.

MAD gates offer a complete set of Boolean operations and the COPY operation using slight variations of the same baseline circuitry. These gates equal or improve the delay, power, and area as compared to all the prior work. Additionally, these designs do not suffer from the concatenation, parallelizability, and fanout challenges that hybrid-CMOS, logic-in-memory, and MAGIC gates approaches have. Lastly, the MAD gates are currently able to be fabricated and modeled, rendering them a more practical option than GOTO-based threshold gate implementations.

Figure 7:
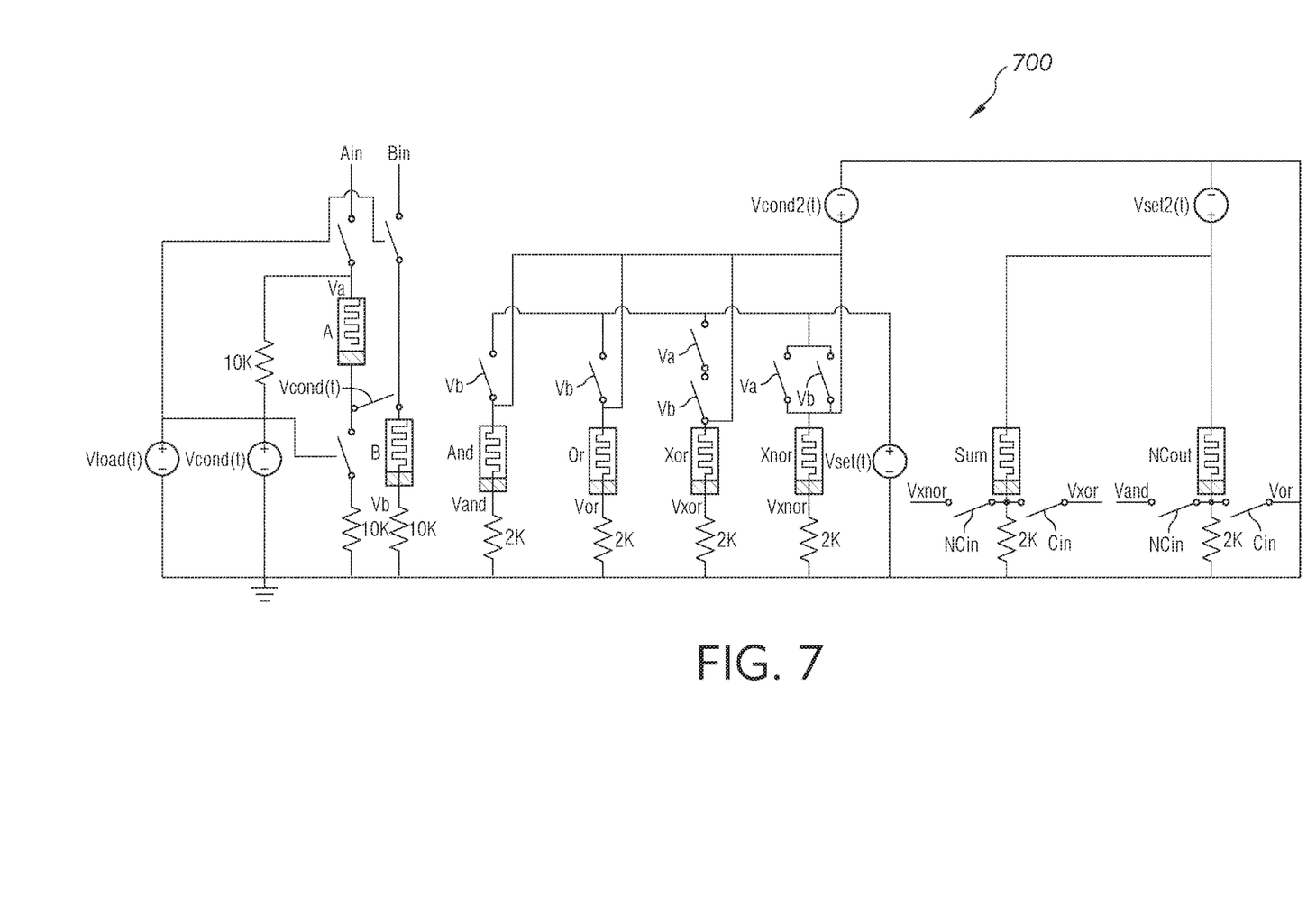
FIG. 7 illustrates a full adder that was constructed using MAD gates in accordance with an embodiment of the present invention.

Using MAD gates, it is possible to construct a full adder 700 as shown in FIG. 7 in accordance with an embodiment of the present invention.

At t=0, inputs A and B are initialized into the sense memristors by applying the $V_{load}$ signal. When $V_{load}$ is applied, memristors A and B are disconnected from each other and the inputs $A_{in}$ and $B_{in}$ are gated into the n terminals of the input memristors. For proper functionality, $V_{load}$ must be greater than the threshold of the associated switches and the strength of $A_{in}$ and $B_{in}$ must be greater than $V_{th}$ of the memristors for the logical value of "1." As used herein, the logical value of "1" for the inputs corresponds to $V_{set}$, $V_{load}=V_{cond}$, and the threshold of the associated switches is 1 V.

Next, the four memristors for the A OR B, A AND B, A XOR B, and A XNOR B operations are resolved. $V_{cond}$ is applied to the input memristors in series and the voltages at $V_a$ and $V_b$ are used to drive the $V_{set}$ signal to the output memristors as described for the gate operations. These can all be done in parallel unlike alternative approaches. Lastly, the sum and inverse carry out results are resolved. In this step, $V_{cond2}$ is applied to the intermediate results and $V_{set2}$ is applied to the sum and inverse carry-out memristors. The carry-in signal and its inverse, $C_{in}$ and $NC_{in}$, drive switches which gate the intermediate values to the p terminals of the sum and carry-out memristors. Essentially, the carry-in signal determines which intermediate result is used as the first parameter for IMPLY operations. If the carry-in signal is a logical value of "1," then the operation (A or B) IMP $0=NC_{out}$ executes else (A AND B) IMP $0=NC_{out}$. Since this is equivalent to a NOT operation, the corresponding equation is $NC_{out}=C_{in}$(A NOR B) or $NC_{in}$(A NAND B). Similarly, if the carry-in signal is a logical value of "1," then the operation (A XOR B) IMP 0=Sum executes, else (A XNOR B) IMP 0=Sum. Equivalently, Sum=$C_{in}$(A XNOR B) or $NC_{in}$(A XOR B). The carry-in strength and the associated switches follow the same voltage requirements as $A_{in}$ and $B_{in}$ and the input memristors. In all, this configuration has a delay of 2 and requires 8 memristors. If the drivers are included, the adder requires 8 memristors, 9 resistors, 5 drivers and 14 switches. The total energy consumption for an addition is 2.62 e-13 J.

Note that resolving the value of the inverse of the carry-out is equivalent to resolving the carry-out. Since MAD designs are based on sensing nodes in the circuit, the value of a memristor and its inverse can be sensed in parallel by using the voltage at either the p or n terminal. This was demonstrated with the NOT and COPY operations as previously discussed. If the value of the carry-out signal is desired in a future step, then the n terminal of the $NC_{out}$ memristor will be sensed when $V_{cond}$ is applied, and if the inverse of the carry-out is desired, the p terminal will be sensed. Thus, this adder not only resolves the sum and inverse carry-out signal, but also the inverse sum and carry-out signals.

This knowledge can be leveraged to extend the full adder to implement an N-bit ripple carry adder. The load and intermediate operation steps execute in the same manner, but can now be performed in parallel across the individual bits. At t=0, the $V_{load}$ driver for the input memristors is applied to each bit as described for the full adder, loading the inputs $A_i$ and $B_i$ into their corresponding full adders. Then, all of the intermediate Boolean operations can be resolved by applying $V_{cond}$ and $V_{set}$, respectively. Lastly, each of the bits can resolve their sum and carry signals one step at a time. Bit 0 resolves its sum and inverse carry-out by applying a $V_{cond}$ signal to the intermediate memristors and a $V_{set}$ signal to the two result memristors. In the next cycle, the inverse carry-out memristor is applied a $V_{cond}$ signal so that the voltage at the n terminal represents the value of the carry-out signal and the voltage at the p terminal represents the inverse. These two voltage strengths drive the gates on the subsequent bit in the same way the carry-in bit did for the full adder. The process then repeats for the subsequent bits until the final sum and carry-out are resolved.

Memristors have recently begun to be researched outside of the memory domain, exploring the potential for memristor-based arithmetic designs. However, the main approaches to memristor logic, namely, IMPLY operations, MAGIC gates, logic-in-memory, hybrid-CMOS gates and threshold gates, all have shortcomings in terms of delay or area or suffer from other characteristics that render them infeasible for many applications. The principles of the present invention provide a new design for memristor-based Boolean operations, MAD gates. The proposed design offers a uniform cell that is configurable to perform all Boolean operations, including the XOR operation. Independent of the operation, MAD gates require at most 3 memristors and 2 drivers, a single step delay, and about 30 fJ in energy. As discussed herein, MAD methodologies may be utilized to design an N-bit ripple carry adder which has a delay of N+1, less than half that of traditional CMOS and the majority of prior work. The area is also competitive requiring only 8N memristors and the accompanying drivers with energy consumption as low as 21.6e-13J for an 8-bit addition. The proposed design also has higher bandwidth than all alternative designs with the ability to begin a new addition every 4 steps.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A logic gate, comprising:
   a first memristor and a second memristor connected in series;
   a switch, wherein a node of said second memristor is connected to said switch;
   a third memristor connected to said switch in series;
   a first voltage source connected to said first memristor via a first resistor;
   a second voltage source connected in series to said switch and third memristor;
   a second resistor connected to said second memristor and ground; and
   a third resistor connected to said third memristor and said ground.

2. The logic gate as recited in claim 1, wherein a magnitude of said first voltage source is selected to be a voltage below a threshold voltage of said first and second memristors, wherein a voltage of said second voltage source is gated to a terminal of said third memristor, wherein a magnitude of said second voltage source is selected to be a voltage above a threshold voltage of said third memristor.

3. The logic gate as recited in claim 1, wherein a voltage of said second voltage source is gated by a voltage at a node of said second memristor.

4. The logic gate as recited in claim 3, wherein if a voltage sensed at said node is greater than a threshold voltage of said switch, then said switch will close and a voltage of said second voltage source will set said third memristor to a logical value of one.

5. The logic gate as recited in claim 3, wherein if a voltage sensed at said node is less than a threshold voltage of said switch, then said switch will open and a voltage of said second voltage source will set said third memristor to a value of zero.

6. The logic gate as recited in claim 1, wherein said node of said second memristor is connected to said second resistor.

7. The logic gate as recited in claim 1, wherein said logic gate performs one of the following logical operations: AND and OR operation.

8. A logic gate, comprising:
   a first memristor and a second memristor connected in series;
   a first switch connected to said first memristor;
   a second switch;
   a third memristor connected to said second switch in series;
   a first voltage source connected to said first memristor via a first resistor; and
   a second voltage source connected in series to said second switch and said third memristor;
   wherein said logic gate performs a logical X-OR operation.

9. The logic gate as recited in claim 8, wherein a node of said second memristor is connected to said second switch.

10. The logic gate as recited in claim 9 further comprising:
    a second resistor connected to said second memristor and ground; and
    a third resistor connected to said third memristor and said ground.

11. The logic gate as recited in claim 10, wherein said node of said second memristor is connected to said second resistor.

12. A logic gate, comprising:
    a first memristor;
    a switch connected to a node of said first memristor;
    a second memristor connected to said switch in series;
    a first voltage source connected to said first memristor via a first resistor; and
    a second voltage source connected in series to said switch and said second memristor;
    wherein said logic gate performs one of the following logical operations: NOT and COPY operations.

13. The logic gate as recited in claim 12 further comprising:
    a second resistor connected to said first memristor and ground; and
    a third resistor connected to said second memristor and said ground.

14. The logic gate as recited in claim 13, wherein said node of said first memristor corresponds to a node connected to said first resistor.

15. The logic gate as recited in claim 13, wherein said node of said first memristor corresponds to a node connected to said second resistor.

* * * * *